US012642088B2

(12) United States Patent
Shu

(10) Patent No.: US 12,642,088 B2
(45) Date of Patent: May 26, 2026

(54) SEMICONDUCTOR DEVICE

(71) Applicant: Sumitomo Electric Device Innovations, Inc., Yokohama (JP)

(72) Inventor: Rai Shu, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 360 days.

(21) Appl. No.: 18/369,952

(22) Filed: Sep. 19, 2023

(65) Prior Publication Data

US 2024/0096735 A1 Mar. 21, 2024

(30) Foreign Application Priority Data

Sep. 21, 2022 (JP) ................................. 2022-150377
Aug. 2, 2023 (JP) ................................. 2023-126345

(51) Int. Cl.
*H10W 40/22* (2026.01)
*H10D 30/47* (2025.01)
*H10D 64/23* (2025.01)

(52) U.S. Cl.
CPC ........ *H10W 40/228* (2026.01); *H10D 30/475* (2025.01); *H10D 64/257* (2025.01)

(58) Field of Classification Search
CPC ............ H01L 23/3677; H01L 23/4824; H10D 30/475; H10D 64/257; H10D 64/254; H10D 62/8503
See application file for complete search history.

(56) References Cited

U.S. PATENT DOCUMENTS

| | | | |
|---|---|---|---|
| 2005/0164482 A1* | 7/2005 | Saxler ................. | H01L 21/0254 |
| | | | 257/E21.128 |
| 2013/0026485 A1* | 1/2013 | Hur ........................ | H10D 64/23 |
| | | | 257/E29.089 |
| 2018/0182663 A1* | 6/2018 | Zhang ............... | H01L 21/76898 |
| 2019/0386126 A1* | 12/2019 | Zhang ................. | H10D 64/254 |
| 2022/0310490 A1* | 9/2022 | Yoshioka ............ | H01L 23/4824 |

FOREIGN PATENT DOCUMENTS

JP 11-150127 A 6/1999

* cited by examiner

*Primary Examiner* — Shahan Ur Rahaman
(74) *Attorney, Agent, or Firm* — Volpe Koenig

(57) ABSTRACT

A semiconductor device includes a substrate, a semiconductor layer provided on the substrate, a gate electrode, a drain electrode, and a source electrode provided so as to dispose the gate electrode between the drain electrode and the source electrode, wherein via holes are provided in the substrate and the semiconductor layer, the via holes overlap with the source electrode when viewed from a thickness direction of the substrate, penetrate through the semiconductor layer and the substrate, and are arranged in an extending direction of the source electrode, the via holes include a first via hole closest to a first end of the gate electrode to which a signal is inputted, the first via hole is in contact with the source electrode with a first area, and the first area is the smallest of a plurality of areas in which the via holes are in contact with the source electrode.

9 Claims, 7 Drawing Sheets

SEMICONDUCTOR DEVICE

CROSS REFERENCE TO RELATED APPLICATIONS

This application claims priority based on Japanese Patent Application No. 2022-150377 filed on Sep. 21, 2022 and Japanese Patent Application No. 2023-126345 filed on Aug. 2, 2023, and the entire contents of the Japanese patent applications are incorporated herein by reference.

FIELD

The present disclosure relates to a semiconductor device.

BACKGROUND

It is known that, in a field effect transistor (FET) having source electrodes, gate electrodes, and drain electrodes, via holes are connected to the source electrodes (for example, Patent Document 1: Japanese Patent Application Laid-Open No. 11-150127).

SUMMARY

A semiconductor device according to the present disclosure includes a substrate; a semiconductor layer provided on the substrate; a gate electrode provided on the semiconductor layer; a drain electrode provided on the semiconductor layer; and a source electrode provided on the semiconductor layer and provided so as to dispose the gate electrode between the drain electrode and the source electrode; wherein a plurality of via holes are provided in the substrate and the semiconductor layer, the plurality of via holes overlap with the source electrode when viewed from a thickness direction of the substrate, penetrate through the semiconductor layer and the substrate, and are arranged in an extending direction of the source electrode, the plurality of via holes include a first via hole closest to a first end of the gate electrode to which a signal is inputted, the first via hole is in contact with the source electrode with a first area, and the first area is the smallest of a plurality of areas in which the plurality of via holes are in contact with the source electrode.

DETAILED DESCRIPTION OF EMBODIMENTS

Figure 1:
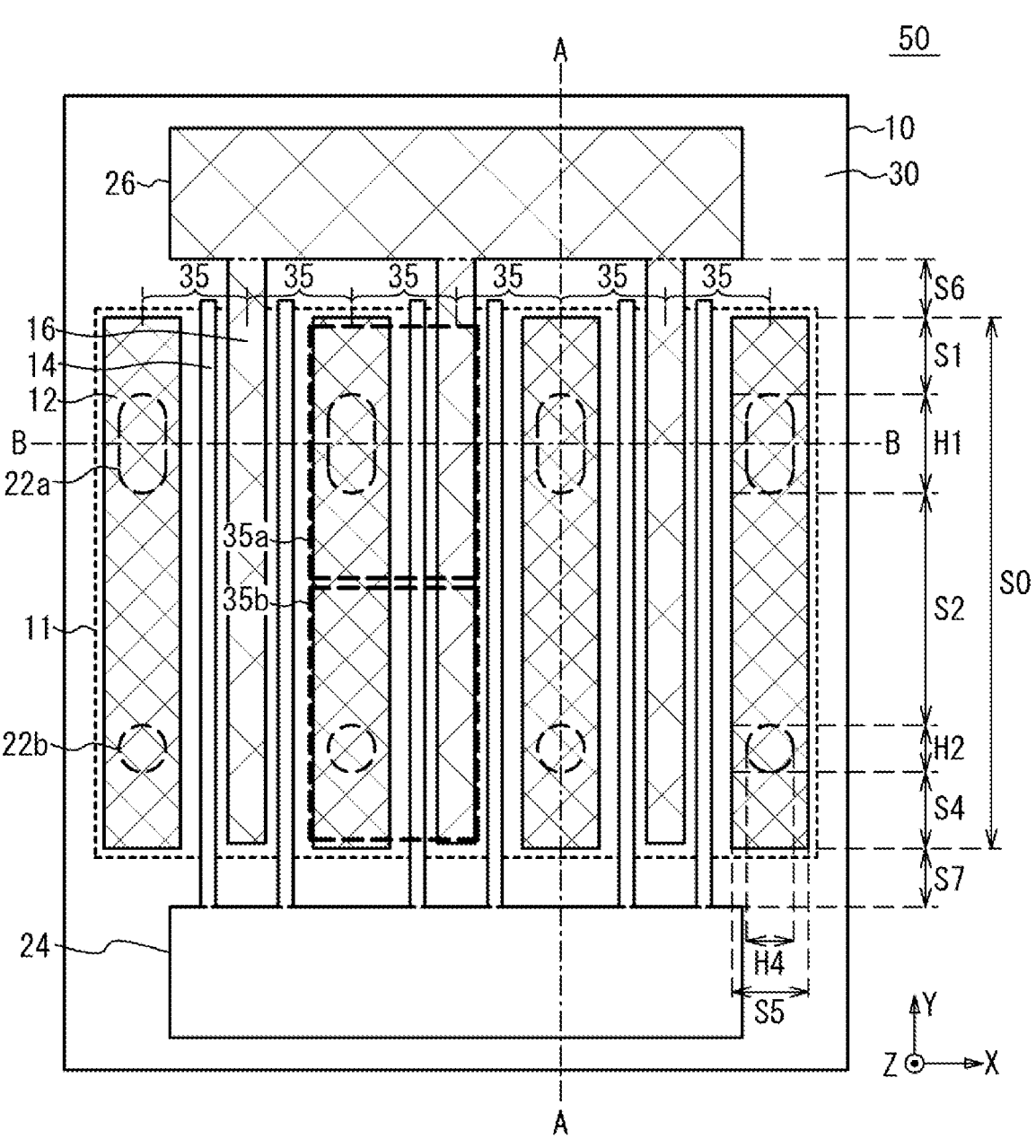
FIG. 1 is a plan view of a semiconductor device according to a first embodiment.

A distribution of a gate voltage occurs in an extending direction of the gate electrode due to a resistance of the gate electrode. As a result, a temperature distribution occurs in the transistor in the extending direction, and a gain is reduced.

The present disclosure has been made in view of the above problems, and an object of the present disclosure is to reduce the temperature distribution in a transistor.

Details of Embodiments of the Present Disclosure

First, the contents of the embodiments of this disclosure are listed and explained.

(1) A semiconductor device according to the present disclosure includes a substrate; a semiconductor layer provided on the substrate; a gate electrode provided on the semiconductor layer; a drain electrode provided on the semiconductor layer; and a source electrode provided on the semiconductor layer and provided so as to dispose the gate electrode between the drain electrode and the source electrode; wherein a plurality of via holes are provided in the substrate and the semiconductor layer, the plurality of via holes overlap with the source electrode when viewed from a thickness direction of the substrate, penetrate through the semiconductor layer and the substrate, and are arranged in an extending direction of the source electrode, the plurality of via holes include a first via hole closest to a first end of the gate electrode to which a signal is inputted, the first via hole is in contact with the source electrode with a first area, and the first area is the smallest of a plurality of areas in which the plurality of via holes are in contact with the source electrode. Thus, the temperature distribution in a transistor as the semiconductor device can be reduced.

(2) In the above (1), the substrate may be a silicon carbide substrate or a diamond substrate.

(3) In the above (1), the substrate may be a 4H silicon carbide substrate or a 6H silicon carbide substrate.

(4) In any one of the above (1) to (3), the plurality of via holes may include a second via hole closest to a second end of the gate electrode opposite to the first end. The second via hole may be in contact with the source electrode with a second area, and the second area may be the largest of the plurality of areas.

(5) In any one of the above (1) to (4), the semiconductor device further may include a filler filled in the plurality of via holes and having a thermal conductivity smaller than a thermal conductivity of the substrate.

(6) In any one of the above (1) to (4), air gaps may exist inside the plurality of via holes.

(7) In any one of the above (1) to (6), the semiconductor device further may include a metal layer provided under the substrate and electrically connected to the source electrode through the plurality of via holes.

(8) In any one of the above (1) to (7), the plurality of via holes may include a third via hole. The third via hole may be provided between the first via hole and the second via hole and be in contact with the source electrode with a third area. The third area may be larger than the first area and smaller than the second area.

(9) In any one of the above (1) to (8), the semiconductor device further may include a plurality of gate electrode provided on the semiconductor layer, a plurality of drain electrode provided on the semiconductor layer, and a plurality of source electrode provided on the semiconductor layer. The plurality of source electrodes and the plurality of drain electrodes may be alternately provided. Each of the plurality of gate electrodes may be disposed between one of the plurality of source electrodes and one of the plurality of drain electrodes. First ends of the plurality of gate electrodes may be electrically connected to a gate bus bar.

(10) In the above (4) or (8), the semiconductor device further may include a plurality of gate electrode provided on the semiconductor layer, a plurality of drain electrode provided on the semiconductor layer, and a plurality of source electrode provided on the semiconductor layer. The plurality of source electrodes and the plurality of drain electrodes may be alternately provided. Each of the plurality of gate electrodes may be disposed between one of the plurality of source electrodes and one of the plurality of drain electrodes. The first area corresponding to a first source electrode in the plurality of source electrodes may be equal to the first area corresponding to a second source electrode adjacent to the first source electrode in the plurality of source electrodes. The second area corresponding to the first source electrode may be equal to the second area corresponding to the second source electrode.

(11) In the above (10), the plurality of via holes may include a third via hole. The third via hole may be provided between the first via hole and the second via hole and is in contact with the source electrode with a third area. The third area may be larger than the first area and smaller than the second area. The third area corresponding to the first source electrode may be equal to the third area corresponding to the second source electrode.

Specific examples of the semiconductor device in accordance with embodiments of the present disclosure are described below with reference to the drawings. The present disclosure is not limited to these examples, but is indicated by the claims, which are intended to include all modifications within the meaning and scope of the claims.

First Embodiment

Figure 2:
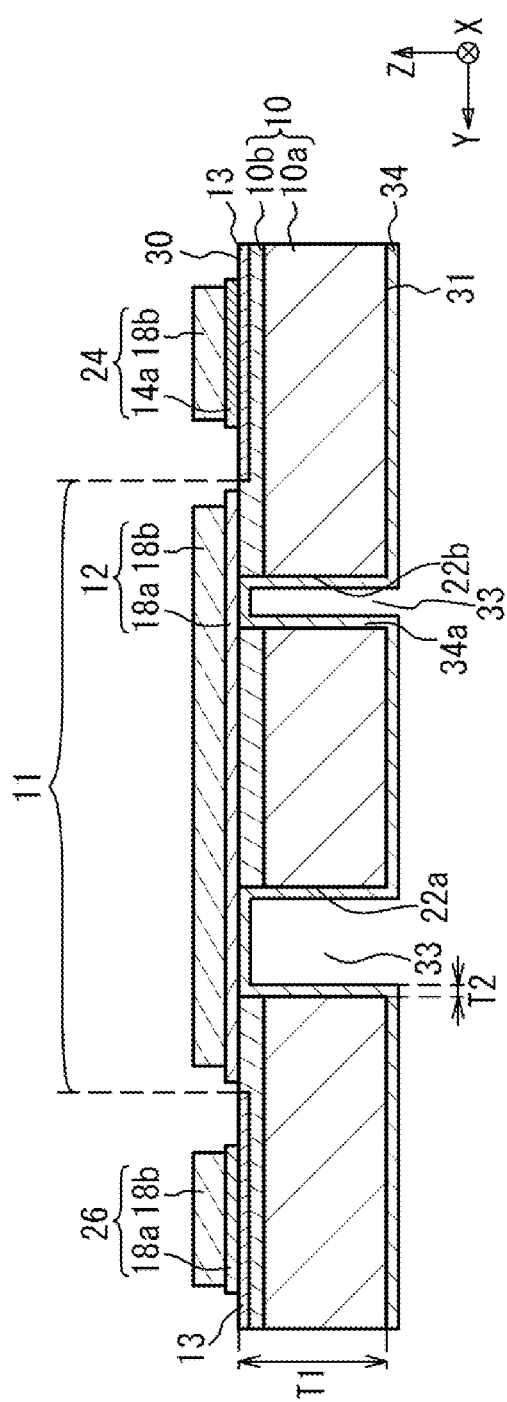
FIG. 2 is a cross-sectional view taken along line A-A of FIG. 1.
Figure 3:
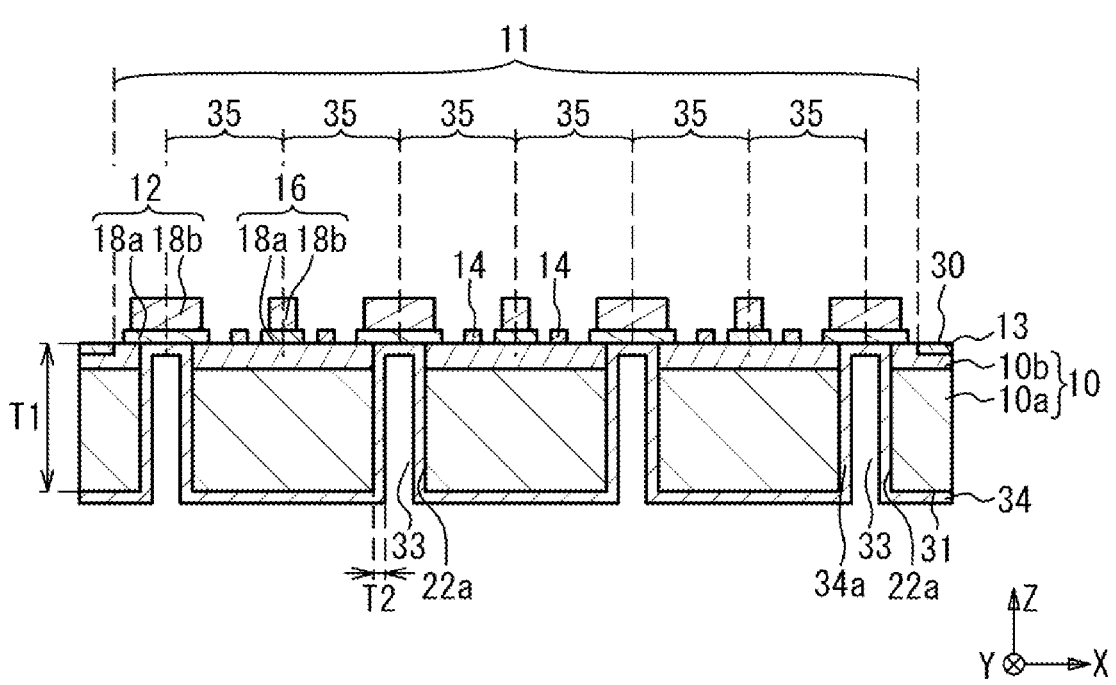
FIG. 3 is a cross-sectional view taken along line B-B of FIG. 1.

FIG. 1 is a plan view of a semiconductor device according to a first embodiment. FIG. 2 is a cross-sectional view taken along line A-A of FIG. 1, and FIG. 3 is a cross-sectional view taken along the line B-B in FIG. 1. A normal direction to a front surface 30 of a substrate 10 is a Z direction, an arrangement direction of each electrode (finger) is an X direction, and an extending direction of each electrode is a Y direction. In the plan view of FIG. 1 and the like, source electrodes 12, drain electrodes 16 and a drain bus bar 26 are illustrated by cross hatching.

As illustrated in FIGS. 1 to 3, in a semiconductor device 50 of the first embodiment, a plurality of unit FETs 35 are provided on the front surface 30 of the substrate 10. The unit FETs 35 are arranged in the X direction. The number of unit FETs 35 may be plural.

The substrate 10 includes a substrate 10a and a semiconductor layer 10b provided on the substrate 10a. An active region 11 is provided on the substrate 10. A region other than the active region 11 is an inactive region 13 in which the semiconductor layer 10b is inactivated by ion implantation or the like. That is, the active region 11 is a region in which the semiconductor layer 10b in the substrate 10 is activated, and the inactive region 13 is a region in which the semiconductor layer 10b is inactivated. The unit FETs 35 are provided in the active region 11.

In the FETs 35, the source electrodes 12 (source finger), gate electrodes 14 (gate finger) and the drain electrodes 16 (drain finger) extending in the Y direction are provided on the active region 11 on the front surface 30 of the substrate 10. The source electrode 12, the gate electrode 14 and the drain electrode 16 are substantially rectangles, and a longer side of the rectangle extends in the Y direction. The source electrode 12, the gate electrode 14 and the drain electrode 16 are arranged in the X direction.

The source electrodes 12 and the drain electrodes 16 are alternately provided in the X direction. The gate electrode 14 is disposed between one source electrode 12 and one drain electrode 16. The source electrode 12 and the drain electrode 16 that dispose the gate electrode 14 therebetween form one unit FET 35. Adjacent unit FETs 35 share the source electrode 12 or the drain electrode 16. The plurality of unit FETs 35 are arranged in the X direction.

A gate bus bar 24 and the drain bus bar 26 are provided on the inactive region 13 of the front surface 30 of the substrate 10, and extend in the X direction. The −Y ends in the Y direction of the plurality of gate electrodes 14 are connected to the gate bus bar 24. The +Y ends in the Y direction of the plurality of drain electrodes 16 are connected to the drain bus bar 26.

Each of the source electrode 12, the drain electrode 16 and the drain bus bar 26 includes an ohmic metal layer 18a and a low resistance layer 18b which are provided on the semiconductor layer 10b. The ohmic metal layer 18a makes an ohmic contact with the semiconductor layer 10b. The material of the low resistance layer 18b has a lower resistivity than the material of the ohmic metal layer 18a. The low resistance layer 18b is thicker than the ohmic metal layer 18a. Thus, a sheet resistance of the low resistance layer 18b is lower than that of the ohmic metal layer 18a. The gate bus bar 24 includes a gate metal layer 14a and the low resistance layer 18b which are provided on the semiconductor layer 10b. The gate metal layer 14a is the same metal layer as the gate electrode 14.

Via holes 22a and 22b penetrating through the substrate 10 are provided under the source electrode 12. The via holes 22a and 22b are arranged in the Y direction. The via holes 22a are close to the drain bus bar 26 and the via holes 22b are close to the gate bus bar 24. The planar shapes of the via holes 22a and 22b are, for example, substantially elliptical or substantially circular. A major axis direction of the via hole 22a is the Y direction, and a minor axis direction thereof is the X direction. A planar area of the via hole 22a (an area in the region in contact with the source electrode 12) is larger than a planar area of the via hole 22b. When viewed from a thickness direction (Z direction) of the substrate 10, the via holes 22a and 22b overlap with the source electrode 12, and regions where the via holes 22a and 22b are connected to the source electrode 12 are contained within the source electrode 12. That is, the via holes 22a and 22b are not provided on the front surface 30 of the substrate 10 outside the source electrode 12.

A metal layer 34 is provided on a rear surface 31 of the substrate 10. A reference potential such as a ground potential is supplied to the metal layer 34. A metal layer 34a is provided on side surfaces and upper surfaces of the via holes 22a and 22b. The metal layer 34a electrically connects and short-circuits the metal layer 34 and the source electrode 12. The metal layer 34a is the same metal layer as the metal layer 34 and is formed at the same time. Air gaps 33 are provided in the metal layer 34a in the via holes 22a and 22b. The air gap 33 is filled with a gas such as air.

When the semiconductor device is, for example, a nitride semiconductor device, the substrate 10a is, for example, a silicon carbide (SiC) substrate, a diamond substrate, a silicon substrate, a gallium nitride (GaN) substrate, or a sapphire substrate. The semiconductor layer 10*b* includes, for example, a nitride semiconductor layer such as a GaN layer, an aluminum gallium nitride (AlGaN) layer and/or an indium gallium nitride (InGaN) layer. In the case of a GaN HEMT (High Electron Mobility Transistor), the semiconductor layer 10*b* includes a GaN electron transport layer and an AlGaN barrier layer provided on the GaN electron transport layer. When the semiconductor device is, for example, a GaAs-based semiconductor device, the substrate 10*a* is, for example, a gallium arsenide (GaAs) substrate. The semiconductor layer 10*b* includes an arsenide semiconductor layer such as a GaAs layer, an aluminum gallium arsenide (AlGaAs) layer and/or an indium gallium arsenide (InGaAs) layer. The ohmic metal layer 18*a* is, for example, an adhesion film (for example, a titanium film) provided on the substrate 10 and an aluminum film provided on the adhesion film. The low resistance layer 18*b* is, for example, a gold layer. The gate electrode 14 and the gate metal layer 14*a* are, for example, an adhesion film (for example, a nickel film) provided on the substrate 10 and a gold film provided on the adhesion film.

A width S0 of the source electrode 12 in the Y direction is, for example, 320 μm. A distance S1 between the +Y end of the source electrode 12 and the +Y end of the via hole 22*a* is, for example, 50 μm. A distance S2 between the −Y end of the via hole 22*a* and the +Y end of the via hole 22*b* is, for example, 150 μm. A distance S4 between the −Y end of the source electrode 12 and the −Y end of the via hole 22*b* is, for example, 50 μm. A width S5 of the source electrode 12 in the X direction is, for example, 50 μm. A distance S6 between the source electrode 12 and the drain bus bar 26 is, for example, 50 μm, and a distance S7 between the source electrode 12 and the gate bus bar 24 is, for example, 50 μm. A width H1 of the via hole 22*a* in the Y direction is, for example, 50 μm, and a width H2 of the via hole 22*b* in the Y direction is, for example, 20 μm. A width H4 of each of the via holes 22*a* and 22*b* in the X direction is, for example, 20 μm.

The length of the gate electrode 14 in the X direction is a gate length, and is, for example, 0.05 μm to 5 μm. The width of the active region 11 in the Y direction is a gate width of the unit FET 35, and is, for example, 10 μm to 1000 μm. The source electrode 12 has a width in the X direction of, for example, 50 μm to 220 μm, and the drain electrode 16 has a width in the X direction of, for example, 5 μm to 500 μm. The widths of the gate bus bar 24 and the drain bus bar 26 in the Y direction are, for example, 10 μm to 500 μm. The thickness of the substrate 10 is, for example, 10 μm to 500 μm. The thickness of the semiconductor layer 10*b* is smaller than the thickness of the substrate 10*a* and is equal to or less than, for example, ⅕ times the thickness of the substrate 10*a*.

First Comparative Example

Figure 4:
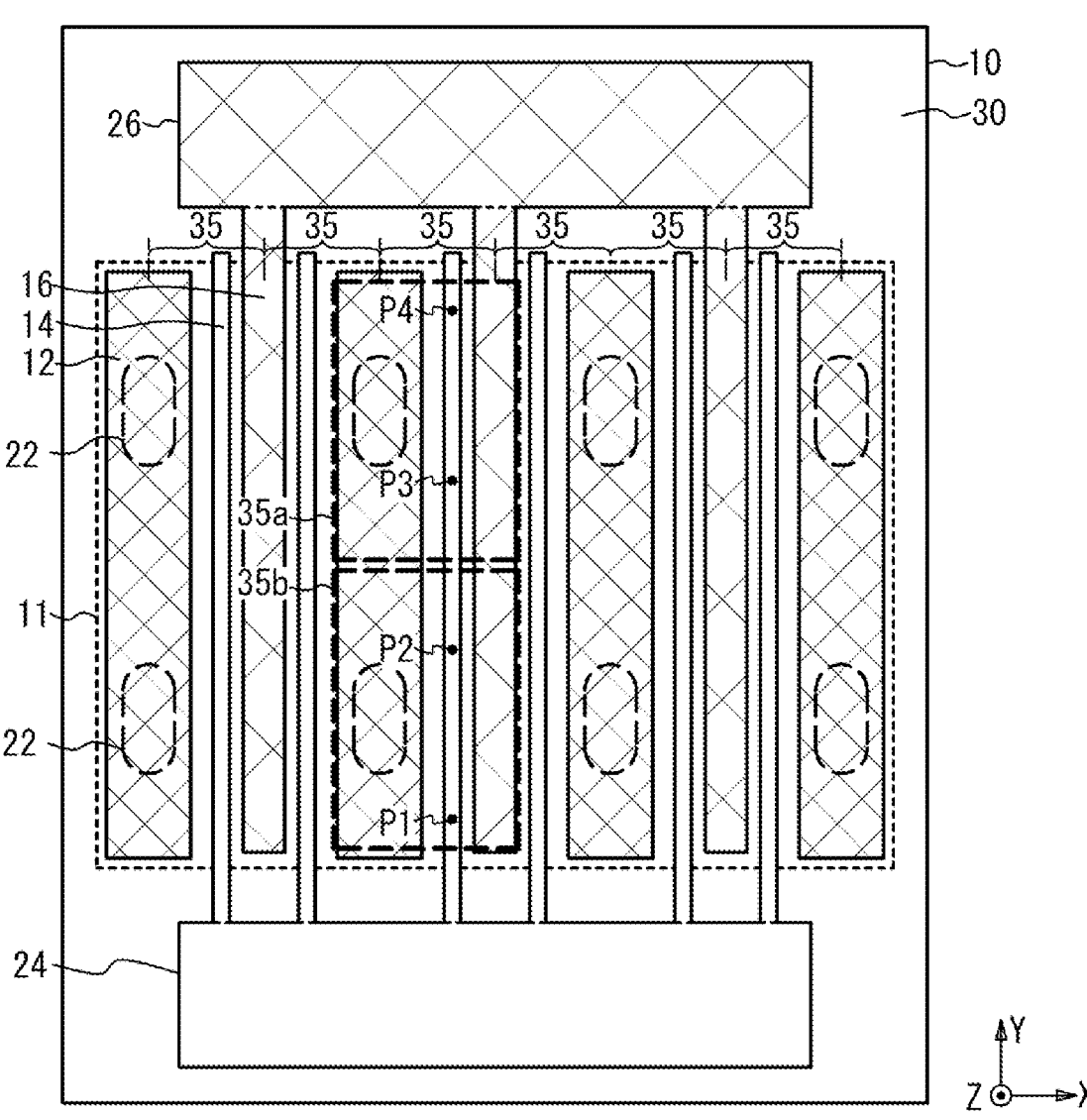
FIG. 4 is a plan view of a semiconductor device according to a first comparative example.

FIG. 4 is a plan view of a semiconductor device according to a first comparative example. As illustrated in FIG. 4, in the semiconductor device of the first comparative example, two via holes 22 have the same planar shape and the same planar area as each other. Other configurations are the same as those of the first embodiment, and description thereof is omitted.

For example, when an FET as a semiconductor device is used in an amplifier circuit of a base station of a mobile communication system, the frequency of a high frequency signal to be used is, for example, 0.5 GHz to 100 GHz. In order to improve the performance of wireless communication, the gain of the FET is improved. In order to improve the gain, the gate length is reduced. Further, in order to increase the output of the amplifier circuit, the gate width is increased. When the gate length of the FET is reduced and the gate width is increased, the resistance of the gate electrode 14 (i.e., gate resistance) is increased.

A signal such as a high frequency signal is input from the gate bus bar 24 to the gate electrode 14 of the unit FET 35. When the gate resistance is large, if the positions in the gate electrode 14 are P1, P2, P3 and P4 from the side of the gate bus bar 24 as illustrated in FIG. 4, the voltage in the gate electrode 14 (that is, the amplitude of the voltage of the high frequency signal) decreases from the position P1 toward the position P4. That is, the input signal is attenuated from the position P1 toward the position P4. Therefore, the heat generated in a region 35*a* within the unit FET 35 far from the gate bus bar 24 is smaller than the heat generated in a region 35*b* near the gate bus bar 24. Therefore, the temperature of the region 35*a* becomes lower than that of the region 35*b*. Thus, the gain in the region 35*a* within the unit FET 35 differs from the gain in the region 35*b* within the unit FET 35. When a gain distribution occurs in one unit FET 35, the gain of the unit FET 35 as a whole decreases. As the frequency of the high frequency signal increases, the influence of the gate resistance increases more and the gain of the unit FET 35 decreases more.

The via hole 22 is provided to suppress the source inductance. However, when the thermal conductivity inside the via hole 22 is smaller than the thermal conductivity of the substrate 10*a*, the thermal resistance from the unit FET 35 to the rear surface 31 of the substrate 10 through the via hole 22 becomes higher than the thermal resistance from the unit FET 35 to the rear surface 31 of the substrate 10 when the via hole 22 is not provided.

Therefore, in the first embodiment, as illustrated in FIGS. 1 to 3, the via hole 22*b* (first via hole) is closest to a first end (an end connected to the gate bus bar 24) of the gate electrode 14 to which the signal is input, in the plurality of via holes provided in the source electrode 12. The via hole 22*a* (second via hole) is closest to a second end of the gate electrode 14, which is opposite to the first end, in the plurality of via holes provided in the source electrode 12. At this time, the first area in which the via hole 22*b* is in contact with the source electrode 12 is made smaller than the second area in which the via hole 22*a* is in contact with the source electrode 12. Thus, the thermal resistance between the region 35*a* of the unit FET 35 and the rear surface 31 of the substrate 10 in FIG. 1 becomes higher than the thermal resistance between the region 35*b* of the unit FET 35 and the rear surface 31 of the substrate 10. Therefore, the heat generated in the region 35*b* is conducted to the rear surface 31 of the substrate 10 more efficiently than the heat generated in the region 35*a*. Accordingly, a difference between the temperature of the region 35*a* and the temperature of the region 35*b* in the first embodiment is smaller than that in the first comparative example, and the temperature distribution in the unit FET 35 is reduced. As a result, the distribution of the gain within one unit FET 35 in the first embodiment is smaller than that in the first comparative example, and the gain of the unit FET 35 is improved as compared with the gain of the unit FET 35 of the first comparative example.

As illustrated in FIGS. 2 and 3, at least part of the via holes 22*a* and 22*b* is the air gap 33. Thus, when at least part of the via holes 22*a* and 22*b* is the air gap 33, the thermal conductivity of the air is very small at about 0.026 W/(m·K), and heat is hard to conduct through the via holes 22*a* and 22*b*. Therefore, the difference between the temperature of the region 35a and the temperature of the region 35b is smaller. As a result, the distribution of the gain within one unit FET 35 is small, and the gain of the unit FET 35 is improved as compared with the gain of the unit FET 35 of the first comparative example.

The first area in which the via hole 22b is in contact with the source electrode 12 is, for example, ¾ or less, preferably ½ or less of the second area in which the via hole 22a is in contact with the source electrode 12. Thus, the temperature distribution in the unit FET 35 can be reduced. If the first area becomes too small, the source inductance becomes large. Therefore, the first area is, for example, ¹⁄₁₀ or more of the second area. Thus, the source inductance can be reduced.

Since it is hard to supply the ground potential to a portion of the source electrode 12 having a long distance from the via holes 22a and 22b, an inductance component is increased. From this viewpoint, when two via holes 22a and 22b are provided in one source electrode 12, the distance S2 is about twice the distance S1 and about twice the distance S4, for example. Further, in order to reduce the temperature distribution in the unit FET 35, a relationship of S1, S2 and S4 is set. Taking these into consideration, the distance S2 may be, for example, 1 times or more and 10 times or less, and preferably 1.5 times or more and 5 times or less of the distance S1 or S4.

The metal layer 34 is provided on the rear surface 31 of the substrate 10 opposite to the front surface 30 thereof and is electrically connected and short-circuited to the source electrode 12 through the via holes 22a and 22b. Thus, the inductance between the source electrode 12 and the metal layer 34 can be reduced. When the reference potential is supplied to the metal layer 34, the source inductance can be reduced.

The −Y ends of the plurality of gate electrodes 14 are electrically connected to the gate bus bar 24. Thus, the signal is input from the gate bus bar 24 to the gate electrode 14. Therefore, in the first comparative example, the temperature of the region 35b is higher than the temperature of the region 35a. Therefore, the planar area of the via hole 22b is made smaller than the planar area of the via hole 22a, so that the temperature distribution in the unit FET 35 can be reduced.

The temperature distribution in one unit FET 35 of the plurality of unit FETs 35 is substantially the same as the temperature distribution in another unit FET 35. Therefore, the first area of the via hole 22b corresponding to a first source electrode in the plurality of source electrodes 12 is made equal to the first area corresponding to a second source electrode adjacent to the first source electrode in the plurality of source electrodes 12. The second area corresponding to the first source electrode and the second area corresponding to the second source electrode are made equal to each other. Thus, both the temperature distribution in a first unit FET and the temperature distribution in a second unit FET can be reduced.

Further, the distances S1, S2, and S4 in the first source electrode are made equal to the distances S1, S2, and S4 in the second source electrode adjacent to the first source electrode, respectively. Thus, both the temperature distribution in the first unit FET and the temperature distribution in the second unit FET can be made smaller. The first area, the second area, and the distances S1, S2, and S4 in the first source electrode are equal (substantially equal) to the first area, the second area, and the distances S1, S2, and S4 in the second source electrode, respectively, as long as the temperature distribution in the first unit FET and the temperature distribution in the second unit FET can be reduced to the same extent. For example, a difference between target numerical values (for example, the difference between the first area of the first source electrode and the first area of the second source electrode) may be within 10% of a target average value (for example, an average value of the first area of the first source electrode and the first area of the second source electrode).

The metal layer 34a is provided on the side surfaces of the via holes 22a and 22b and electrically connects the source electrode 12 and the metal layer 34. The inside of the metal layer 34a in the via holes 22a and 22b is the air gap 33. Thus, a part of the via holes 22a and 22b is made into the air gap 33, and the source electrode 12 and the metal layer 34 can be electrically connected and short-circuited. In order to provide the air gap 33 in the via holes 22a and 22b, a thickness T2 of the metal layer 34a in the via holes 22a and 22b is preferably ½ or less and more preferably ¹⁄₁₀ or less of a thickness T1 of the substrate 10. From the viewpoint that the resistance of the metal layer 34a does not become large, the thickness T2 is, for example, ¹⁄₁₀₀ or more of the thickness T1.

The planar shape of each of the via holes 22a and 22b may be an oval shape, an edge-rounded rectangular shape, a track shape or a polygonal shape in addition to a circular shape and an elliptical shape.

Figure 5:
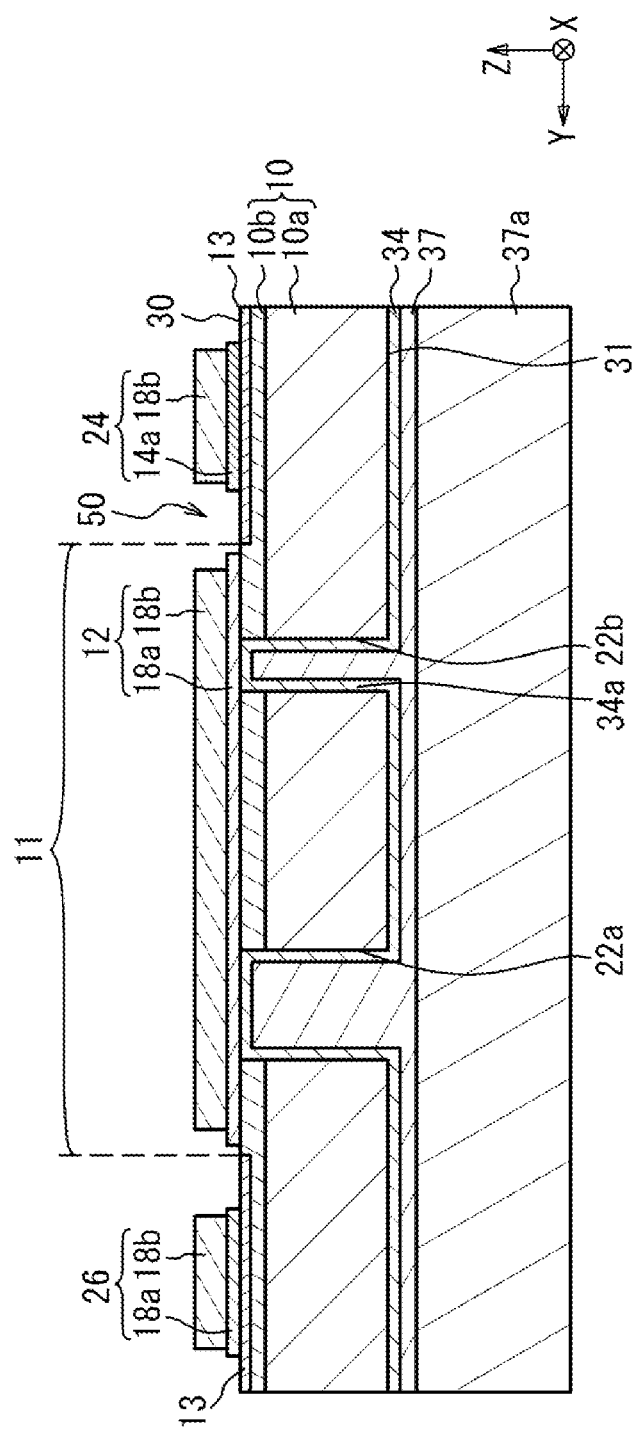
FIG. 5 is a cross-sectional view illustrating an example in which a semiconductor chip is mounted on a mounting substrate in the first embodiment.

FIG. 5 is a cross-sectional view illustrating an example in which a semiconductor chip is mounted on a mounting substrate in the first embodiment. As illustrated in FIG. 5, the semiconductor device 50 of the first embodiment is mounted on a mounting substrate 37a using a brazing material 37. The brazing material 37 is, for example, a solder such as tin-silver-copper or gold-tin, or a metal paste such as silver paste. The via holes 22a and 22b are filled with the brazing material 37. The thermal conductivities of the silicon carbide substrate, the diamond substrate and the silicon substrate used as the substrate 10a are 220 W/(m·K) to 490 W/(m·K), 2200 W/(m·K) and 162 W/(m·K), respectively. The thermal conductivity of SiC depends on the crystal structure, and when the crystal structure of silicon carbide is hexagonal such as 4H and 6H, the thermal conductivity of single-crystal silicon carbide is 490 W/(m·K). On the other hand, as for the thermal conductivity of the brazing material 37, for example, the thermal conductivity of tin-silver-copper solder is 55 W/(m·K) and the thermal conductivity of silver paste is 100 W/(m·K) to 200 W/(m·K). Thus, thermal conductivity of the brazing material is smaller than that of the substrate 10a. Therefore, even when the air gaps 33 in the via holes 22a and 22b are filled with the brazing material 37, the temperature distribution in the unit FET 35 can be reduced by providing the via holes 22a and 22b. In some cases, the via holes 22a and 22b may partially have the air gap. In this case, the thermal conductivities of the via holes 22a and 22b become small. Further, a metal film such as gold (Au) or copper (Cu) having large thermal conductivity may be provided on the inner surfaces of the via holes 22a and 22b. Even in this case, the metal film is sufficiently thin with respect to the size of via holes 22a and 22b. Therefore, the influence of the metal film on the thermal conductivity of the via holes 22a and 22b is small.

Figure 6:
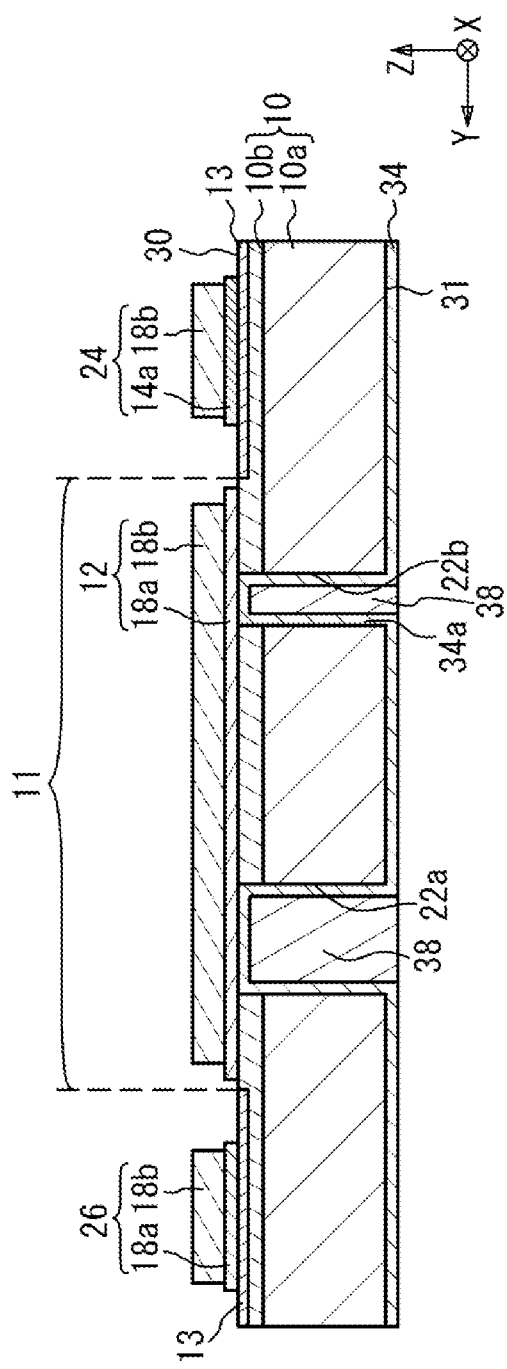
FIG. 6 is a cross-sectional view illustrating another example of via holes in the first embodiment.

FIG. 6 is a cross-sectional view illustrating another example of via holes in the first embodiment. As illustrated in FIG. 6, a filler 38 is filled in the via holes 22a and 22b so that no air gap is formed therein. By providing the filler 38, the mechanical strength of the substrate 10 can be increased. Even in such a structure of the via holes 22a and 22b, when the thermal conductivity of the substrate 10a is larger than the thermal conductivity of the filler 38, the temperature distribution in the unit FET 35 can be reduced by the via holes 22a and 22b. For example, the thermal conductivity of copper and gold is 386 W/(m·K) and 295 W/(m·K), respectively, which is smaller than the thermal conductivity of SiC. The thermal conductivity of the filler 38 is 0.9 times or less, preferably 0.8 times or less, and more preferably 0.5 times or less of the thermal conductivity of the substrate 10a.

When the filler 38 is a conductor, the source inductance can be further suppressed. When the filler 38 is a resin, it is easy to fill the filler 38 in the via holes 22a and 22b. Further, the thermal conductivity of the resin is generally 1 W/(m·K) or less, which is smaller than that of the conductor. Therefore, the temperature distribution in the unit FET 35 can be reduced.

By using a silicon carbide substrate or a diamond substrate as the substrate 10a, the thermal conductivity of the substrate 10a can be increased. Therefore, by providing the via holes 22a and 22b, the temperature distribution in the unit FET 35 can be further reduced. By using a 4H silicon carbide substrate or a 6H silicon carbide substrate as the substrate 10a, the thermal conductivity of the substrate 10a can be further increased.

Second Embodiment

Figure 7:
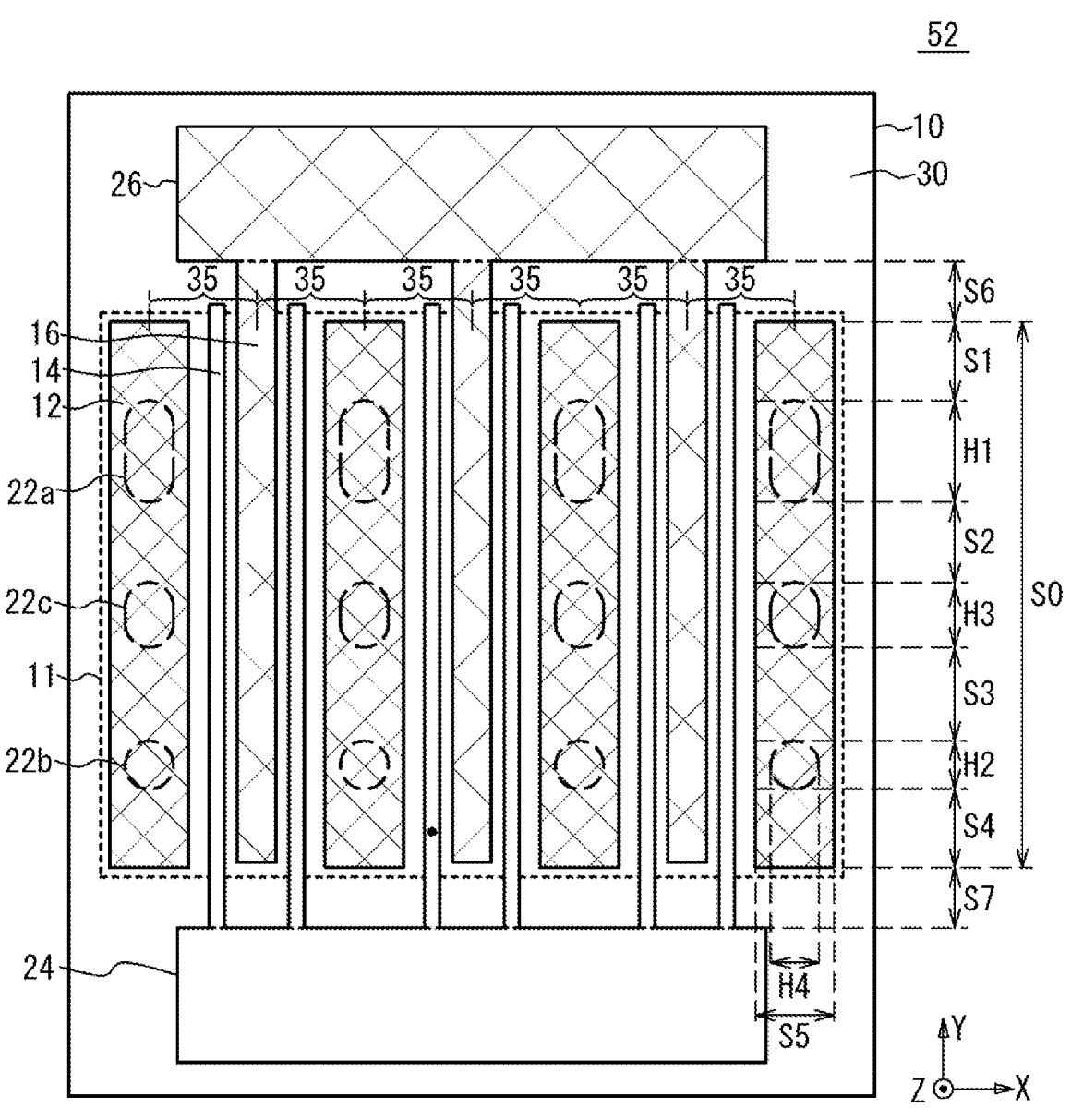
FIG. 7 is a plan view of a semiconductor device according to a second embodiment.

FIG. 7 is a plan view of a semiconductor device according to a second embodiment. As illustrated in FIG. 7, in a semiconductor device 52 of the second embodiment, a via hole 22c (third via hole) is provided between the via holes 22a and 22b. A third area in which the via hole 22c is in contact with the source electrode 12 is larger than the first area in which the via hole 22b is in contact with the source electrode 12 and smaller than the second area in which the via hole 22a is in contact with the source electrode 12. By increasing the number of via holes 22a to 22c, the temperature distribution in the unit FET 35 can be further reduced. Other configurations are the same as those of the first embodiment, and description thereof is omitted.

When three or more via holes 22a to 22c are provided in one source electrode 12 as in the second embodiment, the first area in which the via hole 22b is in contact with the source electrode 12 is made the smallest of the areas in which the via holes 22a to 22c are contact with the source electrode 12. Thus, the thermal resistance between the front surface 30 and the rear surface 31 of the substrate 10 near the via hole 22b can be reduced. Therefore, the temperature distribution in the unit FET 35 can be reduced.

Further, the second area in which the via hole 22a is in contact with the source electrode 12 is made the largest of the areas in which the via holes 22a to 22c are in contact with the source electrode 12. Thus, the thermal resistance between the front surface 30 and the rear surface 31 of the substrate 10 near the via hole 22a can be increased. Therefore, the temperature distribution in the unit FET 35 can be further reduced.

Further, the first area of the via hole 22b corresponding to the first source electrode in the plurality of source electrodes 12 is made equal to the first area corresponding to the second source electrode adjacent to the first source electrode in the plurality of source electrodes 12. The second area corresponding to the first source electrode and the second area corresponding to the second source electrode are made equal to each other. The third area corresponding to the first source electrode and the third area corresponding to the second source electrode are made equal to each other. Thus, both the temperature distribution in the first unit FET and the temperature distribution in the second unit FET can be reduced.

The width S0 of the source electrode 12 in the Y direction is, for example, 320 μm. The distance S1 between the +Y end of the source electrode 12 and the +Y end of the via hole 22a is, for example, 50 μm. The distance S2 between the –Y end of the via hole 22a and the +Y end of the via hole 22c is, for example, 50 μm. The distance S3 between the –Y end of the via hole 22c and the +Y end of the via hole 22b is, for example, 70 μm. The distance S4 between the –Y end of the source electrode 12 and the –Y end of the via hole 22b is, for example, 50 μm. The width S5 of the source electrode 12 in the X direction is, for example, 50 μm. The distance S6 between the source electrode 12 and the drain bus bar 26 is, for example, 30 μm. The distance S7 between the source electrode 12 and the gate bus bar 24 is, for example, 30 μm. The width H1 of the via hole 22a in the Y direction is, for example, 50 μm. The width H3 of the via hole 22c in the Y direction is, for example, 30 μm. The width H2 of the via hole 22b in the Y direction is, for example, 20 μm. The width H4 of each of the via holes 22a to 22c in the X direction is, for example, 20 μm.

The third area in which the via hole 22c is in contact with the source electrode 12 is, for example, ⅞ or less, preferably ¾ or less of the second area in which the via hole 22a is in contact with the source electrode 12. The first area in which the via hole 22b is in contact with the source electrode 12 is, for example, ⅞ or less, preferably ¾ or less of the third area. Thus, the temperature distribution in the unit FET 35 can be reduced. The third area is, for example, 1/20 or more of the second area. The first area is, for example, 1/20 or more of the third area. Thus, the source inductance can be reduced.

From the viewpoint of lowering the thermal resistance between the region 35a of the unit FET 35 and the rear surface 31 of the substrate 10, the distance S3 is made larger than the distance S2, for example. Thus, the heat generated in the region 35a can be efficiently conducted to the rear surface 31. Therefore, the temperature distribution in the unit FET 35 can be further reduced.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:
   a substrate;
   a semiconductor layer provided on the substrate;
   a gate electrode provided on the semiconductor layer;
   a drain electrode provided on the semiconductor layer; and
   a source electrode provided on the semiconductor layer and provided so as to dispose the gate electrode between the drain electrode and the source electrode;
   wherein a plurality of via holes are provided in the substrate and the semiconductor layer,
   wherein the plurality of via holes overlap with the source electrode when viewed from a thickness direction of the substrate, penetrate through the semiconductor layer and the substrate, and are arranged in an extending direction of the source electrode,
   wherein the plurality of via holes include a first via hole closest to a first end of the gate electrode to which a signal is inputted,
   wherein the first via hole is in contact with the source electrode with a first area, the first area being the smallest of a plurality of areas in which the plurality of via holes are in contact with the source electrode, wherein the plurality of via holes include a second via hole closest to a second end of the gate electrode opposite to the first end, the second via hole is in contact with the source electrode with a second area, and the second area of the second via hole is larger than the first area of the first via hole, and wherein the substrate is a silicon carbide substrate or a diamond substrate.

2. The semiconductor device according to claim 1, wherein the substrate is a 4H silicon carbide substrate or a 6H silicon carbide substrate.

3. The semiconductor device according to claim 1, further comprising:

a filler filled in the plurality of via holes and having a thermal conductivity smaller than a thermal conductivity of the substrate.

4. The semiconductor device according to claim 1, wherein air gaps exist inside the plurality of via holes.

5. The semiconductor device according to claim 1, further comprising:

a metal layer provided under the substrate and electrically connected to the source electrode through the plurality of via holes.

6. The semiconductor device according to claim 1, wherein the plurality of via holes include a third via hole, the third via hole is provided between the first via hole and the second via hole and is in contact with the source electrode with a third area, and the third area is larger than the first area and smaller than the second area.

7. The semiconductor device according to claim 1, further comprising:

a plurality of gate electrode provided on the semiconductor layer;

a plurality of drain electrode provided on the semiconductor layer; and a plurality of source electrode provided on the semiconductor layer;

wherein the plurality of source electrodes and the plurality of drain electrodes are alternately provided, each of the plurality of gate electrodes is disposed between one of the plurality of source electrodes and one of the plurality of drain electrodes, and first ends of the plurality of gate electrodes are electrically connected to a gate bus bar.

8. The semiconductor device according to claim 1, further comprising:

a plurality of gate electrode provided on the semiconductor layer;

a plurality of drain electrode provided on the semiconductor layer; and a plurality of source electrode provided on the semiconductor layer;

wherein the plurality of source electrodes and the plurality of drain electrodes are alternately provided, each of the plurality of gate electrodes is disposed between one of the plurality of source electrodes and one of the plurality of drain electrodes, the first area corresponding to a first source electrode in the plurality of source electrodes is equal to the first area corresponding to a second source electrode adjacent to the first source electrode in the plurality of source electrodes, and the second area corresponding to the first source electrode is equal to the second area corresponding to the second source electrode.

9. The semiconductor device according to claim 8, wherein the plurality of via holes include a third via hole, the third via hole is provided between the first via hole and the second via hole and is in contact with the source electrode with a third area, the third area is larger than the first area and smaller than the second area, and the third area corresponding to the first source electrode is equal to the third area corresponding to the second source electrode.

* * * * *